(12) United States Patent
Sekiya et al.

(10) Patent No.: US 10,693,451 B2
(45) Date of Patent: Jun. 23, 2020

(54) RINGING SUPPRESSOR CIRCUIT

(71) Applicants: SOKEN, INC., Nisshin, Aichi-pref. (JP); DENSO CORPORATION, Kariya, Aichi-pref. (JP)

(72) Inventors: Youhei Sekiya, Nishio (JP); Hiroyuki Mori, Nishio (JP); Tomohisa Kishigami, Kariya (JP)

(73) Assignees: SOKEN, INC., Nisshin (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 16/273,810

(22) Filed: Feb. 12, 2019

(65) Prior Publication Data

US 2019/0288680 A1 Sep. 19, 2019

(30) Foreign Application Priority Data

Mar. 16, 2018 (JP) .................. 2018-049410

(51) Int. Cl.
| | |
|---|---|
| *H03K 17/16* | (2006.01) |
| *H04L 25/02* | (2006.01) |
| *H04B 3/42* | (2006.01) |
| *H03H 11/24* | (2006.01) |
| *H04L 12/40* | (2006.01) |

(52) U.S. Cl.
CPC .......... *H03K 17/16* (2013.01); *H03H 11/245* (2013.01); *H04B 3/42* (2013.01); *H04L 12/40006* (2013.01); *H04L 25/026* (2013.01); *H04L 25/0272* (2013.01); *H04L 2012/40215* (2013.01)

(58) Field of Classification Search
USPC .................................. 327/108–112
See application file for complete search history.

(56) References Cited

U.S. PATENT DOCUMENTS

| | | | |
|---|---|---|---|
| 10,020,841 B2* | 7/2018 | De Haas | H04L 25/0272 |
| 10,128,825 B2* | 11/2018 | Mori | H03K 5/08 |
| 10,164,620 B1* | 12/2018 | Honda | H03K 19/00361 |
| 2010/0296318 A1* | 11/2010 | Teo | H02M 1/44 363/21.03 |
| 2011/0169547 A1* | 7/2011 | Suzuki | H03K 19/00361 327/384 |
| 2012/0293230 A1* | 11/2012 | Mori | H04L 25/026 327/313 |

(Continued)

FOREIGN PATENT DOCUMENTS

| | | | | |
|---|---|---|---|---|
| JP | 2017050839 A | * | 3/2017 | ......... H03K 5/1252 |
| JP | 2017216579 A | * | 12/2017 | ......... H04L 25/028 |

(Continued)

*Primary Examiner* — Adam D Houston
(74) *Attorney, Agent, or Firm* — Posz Law Group, PLC

(57) ABSTRACT

A ringing suppressor circuit is connected to a differential signal transmission line that includes a high potential signal line and low potential signal line pair for transmitting high and low level differential signals, and includes a ringing suppressor and a stopper. When the differential signal changes to a high level, the ringing suppressor suppresses ringing by lowering the impedance between the signal lines by turning ON of a switching element. When a differential signal voltage drops below a voltage lowering determination voltage, the stopper stops the impedance lowering function of the ringing suppressor by turning OFF another switching element.

4 Claims, 7 Drawing Sheets

(56) References Cited

U.S. PATENT DOCUMENTS

| | | | |
|---|---|---|---|
| 2013/0162901 A1* | 6/2013 | Thompson | H04N 7/01 348/441 |
| 2016/0087530 A1* | 3/2016 | Gambetta | H02M 3/158 323/271 |
| 2017/0257140 A1* | 9/2017 | De Haas | H03K 5/1534 |
| 2017/0262394 A1* | 9/2017 | De Haas | G06F 13/4282 |
| 2018/0248542 A1* | 8/2018 | Mori | H03K 5/08 |
| 2018/0287642 A1* | 10/2018 | Hell | H04L 12/40 |
| 2018/0367127 A1* | 12/2018 | Honda | H03K 19/00361 |
| 2019/0089559 A1* | 3/2019 | Isomura | B60R 16/023 |
| 2019/0097681 A1* | 3/2019 | Honda | H03K 5/1252 |
| 2019/0158143 A1* | 5/2019 | Honda | H03K 19/0185 |
| 2019/0158144 A1* | 5/2019 | Honda | H03K 19/0185 |
| 2019/0288680 A1* | 9/2019 | Sekiya | H03H 11/245 |

FOREIGN PATENT DOCUMENTS

| | | | | |
|---|---|---|---|---|
| JP | 2017228920 A | * | 12/2017 | H03K 19/0175 |
| JP | 2018019322 A | * | 2/2018 | H03K 19/0175 |
| JP | 2018019323 A | * | 2/2018 | H03K 19/0175 |
| JP | 2018033130 A | * | 3/2018 | H04L 25/028 |

* cited by examiner

RINGING SUPPRESSOR CIRCUIT

CROSS REFERENCE TO RELATED APPLICATION

The present application is based on and claims the benefit of priority of Japanese Patent Application No. 2018-049410, filed on Mar. 16, 2018, the disclosure of which is incorporated herein by reference.

TECHNICAL FIELD

The present disclosure relates to a circuit that is connected to a transmission line that transmits a differential signal by a high/low potential pair of signal lines and that suppresses ringing during the transmission of the differential signal.

BACKGROUND INFORMATION

When a digital signal is transmitted via a transmission line, part of the signal energy on the receiving side (i.e., at the receiver) is reflected when the signal level changes. Such a reflection, known commonly as "ringing," can cause distortions in the signal waveform such as overshoot or undershoot.

In differential signal transmission where a signal is transmitted over a high/low potential pair of signal lines, ringing may be suppressed by lowering the impedance between the pair of signal lines. However, problems may arise in lowering the impedance between the signal lines. As such, ringing suppression for differential communication systems is subject to improvement.

SUMMARY

The present disclosure describes a ringing suppressor circuit capable of suppressing ringing and limiting and/or preventing an excessive voltage drop of a differential signal from a high level voltage.

BRIEF DESCRIPTION OF THE DRAWINGS

Objects, features, and advantages of the present disclosure will become more apparent from the following detailed description made with reference to the accompanying drawings, in which.

DETAILED DESCRIPTION

When a digital signal is transmitted via a transmission line, part of the signal energy on the receiving side (i.e., at the receiver) is reflected when the signal level changes. Such a reflection, known commonly as "ringing," can cause distortions in the signal waveform such as overshoot or undershoot.

A ringing suppressor (i.e., a ringing suppressor circuit) may be able to detect when the signal level of a differential signal changes. The ringing suppressor may include a switching element provided at a position between a pair of signal lines that may be turned ON for a certain period of time to lower an impedance between the pair of signal lines when the signal level of the differential signal changes. In such manner, the ringing suppressor may be able to suppress (i.e., limit and/or prevent) ringing in the differential signal.

However, when the signal changes from a low level to high level and the switching element is turned ON to lower the impedance between the signal lines, it is possible for the ringing suppressor to lower the voltage of the differential signal to a level lower than the high level voltage. That is, the ringing suppressor may lower the differential voltage between the signal lines when the signal is at a high level to a voltage lower than the high level voltage. Communication problems may occur when the voltage of a high level signal is excessively lowered and the signal appears like a low level signal.

The present disclosure describes a ringing suppressor circuit capable of suppressing ringing and limiting and/or preventing an excessive voltage drop of a differential signal from a high level voltage.

The embodiments of the present disclosure are described with reference to the drawings.

1. First Embodiment

1-1. Configuration

Figure 1:
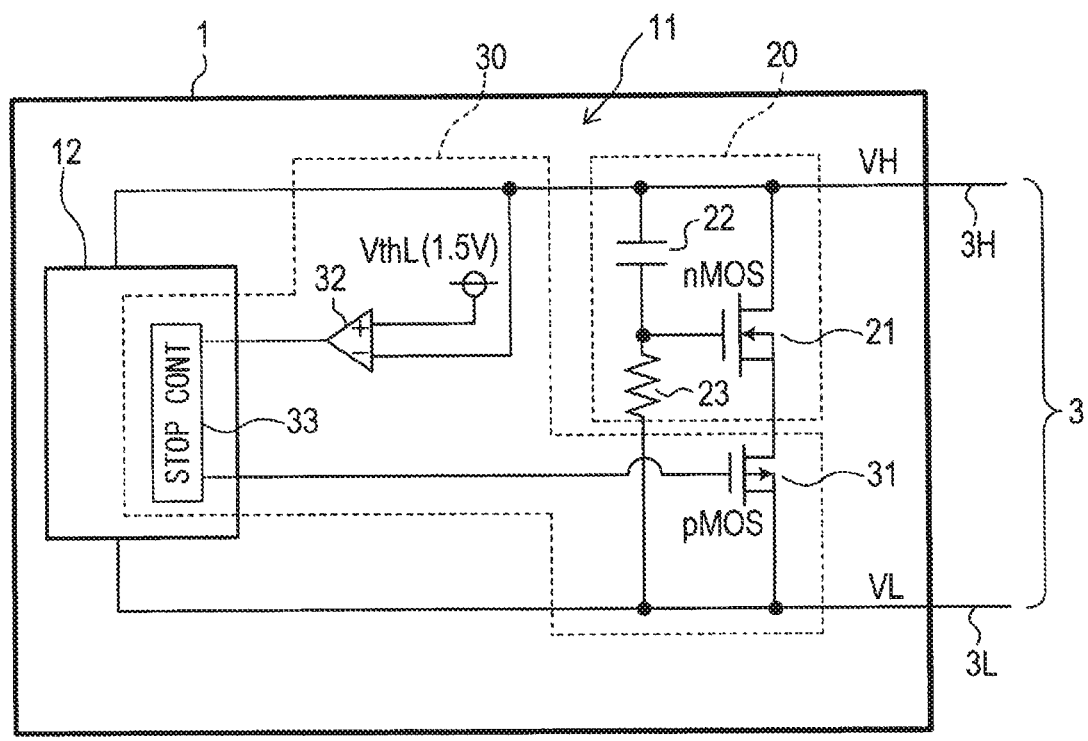
FIG. 1 illustrates a configuration of an ECU including a ringing suppressor circuit according to a first embodiment of the present disclosure.

As shown in FIG. 1, a ringing suppressor circuit 11 in the first embodiment is provided in an electronic control unit (ECU) 1 together with a reception circuit 12 for communication with other ECUs. The reception circuit 12 may be configured as either a transmission and reception circuit, or as a transmission circuit.

The ringing suppressor circuit 11 is connected in parallel with the reception circuit 12 between a high potential signal line 3H and a low potential signal line 3L. The high potential signal line 3H together with the low potential signal line 3L are part of, and form, a transmission line 3. The transmission line 3 transmits a differential signal that changes between a high level signal and a low level signal via the high potential signal line 3H and the low potential signal line 3L. As such, the transmission line 3 is a differential transmission line.

In the present embodiment, when the transmission line 3 is in a non-drive state, both the high potential signal line 3H and the low potential signal line 3L are at an intermediate voltage level of, for example, 1.5 V. When both of the signal lines 3H and 3L are 1.5 V; the voltage of the differential signal, that is; the differential voltage between the signal lines 3H and 3L, is 0 V, which is a low level voltage. That is, the differential signal is at a low level. In the present embodiment, 0 V is a standard reference value for the low level differential voltage.

When the transmission line 3 is driven by a transmission circuit (not shown), the high potential signal line 3H is at 2.5 V, for example, and the low potential signal line 3L is at 0.5 V Here, the differential voltage between the high potential signal line 3H and the low potential signal line 3L is 2 V, which is a high level voltage. That is, the differential signal is at a high level. In the present embodiment, 2 V is a standard reference value for the high level differential voltage.

Though not shown in the drawing, the ends of both the high potential signal line 3H and the low potential signal line 3L are terminated by a resistance element. The resistance element may have an example resistance of 120Ω. The present embodiment may use a controller area network (CAN) protocol as a communication protocol. The CAN protocol is a protocol that may be used, for example, in an in-vehicle local area network (LAN). CAN is a registered trademark. In the CAN protocol, differential signals at the low level are referred to as "recessive" and differential signals at the high level are referred to as "dominant."

The ringing suppressor circuit 11 includes a ringing suppressor 20 for suppressing ringing caused by transmission of the differential signal on the transmission line 3. The ringing suppressor 20 may be referred to simply as the suppressor 20. The ringing suppression circuit 11 also includes a stopper 30 for forcibly stopping the function of the suppressor 20 when a predetermined condition is satisfied.

The suppressor 20 includes an N-type MOSFET (nMOS) 21 as a switching element for lowering the impedance between the signal lines 3H and 3L. The suppressor 20 also includes a capacitor 22 and a resistance element 23 connected in series as a circuit for controlling the nMOS 21.

The drain of the nMOS 21 is connected to the high potential signal line 3H. A common connection point between the capacitor 22 and the resistance element 23 is connected to the gate of the nMOS 21, while one terminal of the capacitor 22 is connected to the high potential signal line 3H and one terminal of the resistance element 23 is connected to the low potential signal line 3L, as shown in FIG. 1.

The stopper 30 includes a P-type MOSFET (pMOS) 31 as a switching element for stopping the ringing suppression function of the suppressor 20. The stopper 30 also includes a comparator 32 and a stop controller 33 that controls the pMOS 31 based on an output of the comparator 32. Though FIG. 1 shows the stop controller 33 included in the reception circuit 12, the stop controller 33 may be provided separately from the reception circuit 12.

The drain and source of the pMOS 31 are connected between the source of the nMOS 21 and the low potential signal line 3L. The gate of the pMOS 31 is connected to the stop controller 33.

The comparator 32 compares the voltage (VH) of the high potential signal line 3H with a predetermined lower voltage threshold (VthL). When the voltage VH drops below the lower voltage threshold VthL, the comparator 32 outputs a high level output signal. The output signal of the comparator 32 is input to the stop controller 33.

The lower voltage threshold VthL is lower than the voltage VH (i.e., 2.5 V) when the differential signal is at the high level. For example, in the present embodiment the lower voltage threshold VthL may be set to 1.5 V In the present embodiment, it is assumed that the voltage of the low potential signal line 3L (VL) is 0.5 V when the differential signal changes to the high level. The comparator 32 then determines whether the differential voltage has dropped below 1 V, where 1 V is derived from the difference between the lower voltage threshold VthL and the voltage VL (i.e., 1.5 V–0.5V). Here, such a difference may be referred to as the voltage lowering determination value or voltage, and in this example, the voltage lowering determination value is lower than the high level voltage of 2 V, where the high level voltage is the differential voltage between VH and VL when the transmission line 3 is being driven. The stopper 30 may set both the lower voltage threshold VthL and the voltage lowering determination voltage/value. More specifically, the stopper 30 is configured to set the voltage lowering determination voltage lower than the differential voltage of the differential signal when the differential signal is being transmitted via the transmission line 3 at the high level.

The lower voltage threshold VthL may be a voltage other than 1.5 V, such that the voltage lowering determination value is a voltage other than 1 V The difference between the VH and VL voltages, that is, the differential voltage, may be detected by an operational amplifier. The detected differential voltage and the voltage lowering determination voltage of 1 V may then be compared by the comparator 32.

Figure 2:
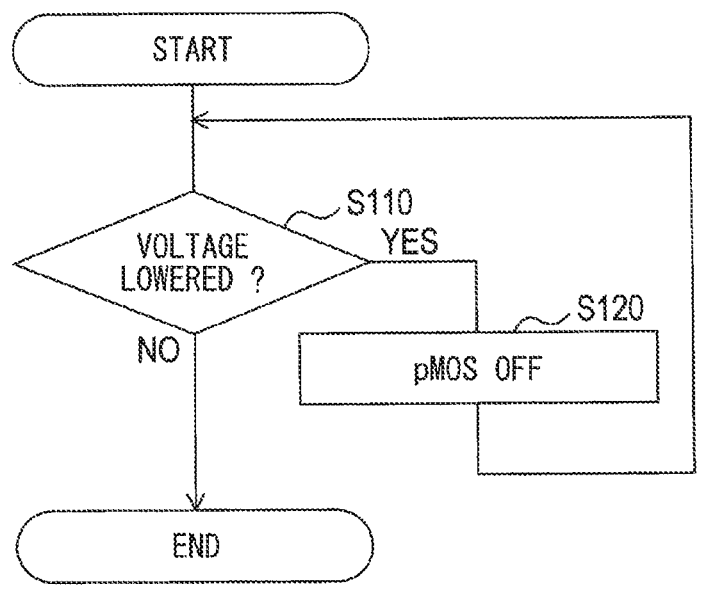
FIG. 2 is a flowchart of an operation of a stop controller according to the first embodiment of the present disclosure.

The stop controller 33 in normal operation turns ON the pMOS 31 and performs the process shown in FIG. 2. At S110, the stop controller 33 determines whether the differential voltage (i.e., VH–VL) has dropped below the voltage lowering determination value of 1 V based on the output signal of the comparator 32. More specifically, when the output signal of the comparator 32 is high, the stop controller 33 determines that the voltage VH has dropped below the lower voltage threshold VthL, and as such, the differential voltage has dropped below the voltage lowering determination voltage.

When the stop controller 33 determines that the differential voltage has dropped below the voltage lowering determination voltage, i.e., "YES" at S110, the process proceeds to S120. At S120, the stop controller 33 turns OFF the pMOS 31 for a preset time TS, and then the stop controller 33 performs the determination at S110 again. The preset time TS may be shorter than the time for one bit of communication.

Turning OFF the pMOS 31 disconnects the nMOS 21 from the signal lines 3H and 3L, which forces the stop of the impedance lowering by the suppressor 20. The preset time TS is measured by a clock in the reception circuit 12. The preset time TS may also be measured by an analog charge/discharge circuit composed of a capacitor, a resistance element, or like circuit elements.

1-2. Operation of the Suppressor

When the stop controller turns the pMOS 31 ON, the source of the nMOS 21 is connected to the low potential signal line 3L and the suppressor 20 can perform a ringing suppression function.

Figure 3:
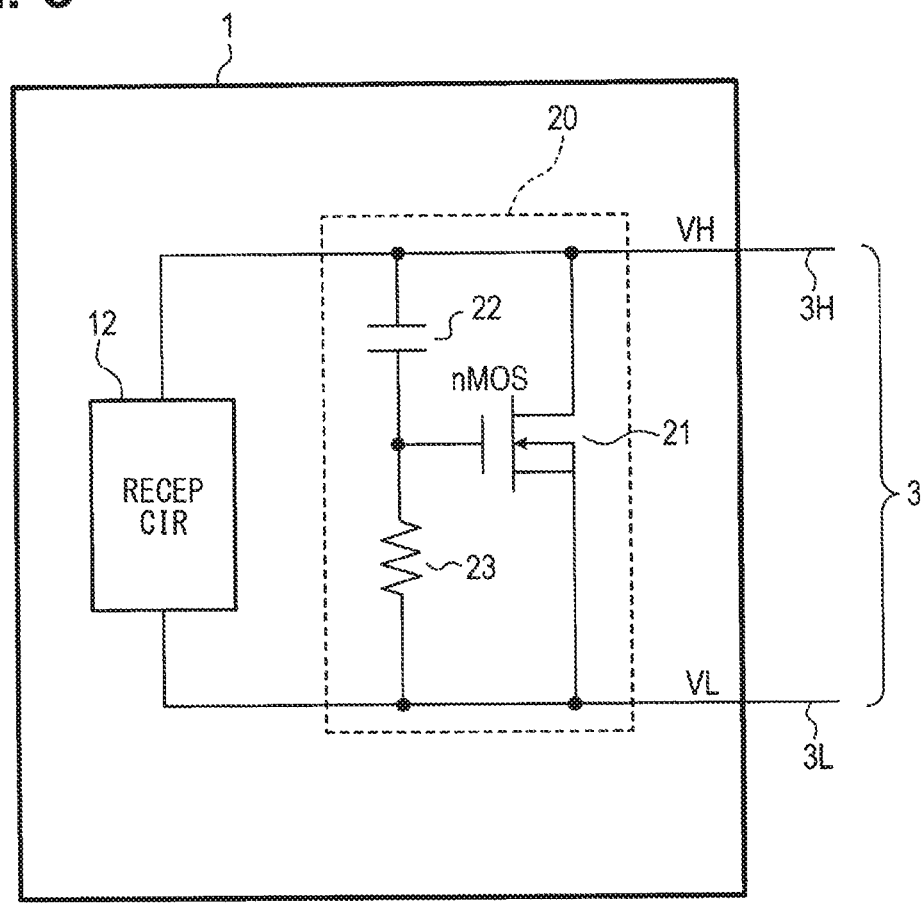
FIG. 3 illustrates a configuration of an equivalent circuit of a ringing suppressor of the first embodiment when a function of the ringing suppressor is validated.

As shown in FIG. 3, the operation and effect of the suppressor 20 are described based on the assumption that the source of the nMOS 21 is always connected to the low potential signal line 3L.

Figure 4:
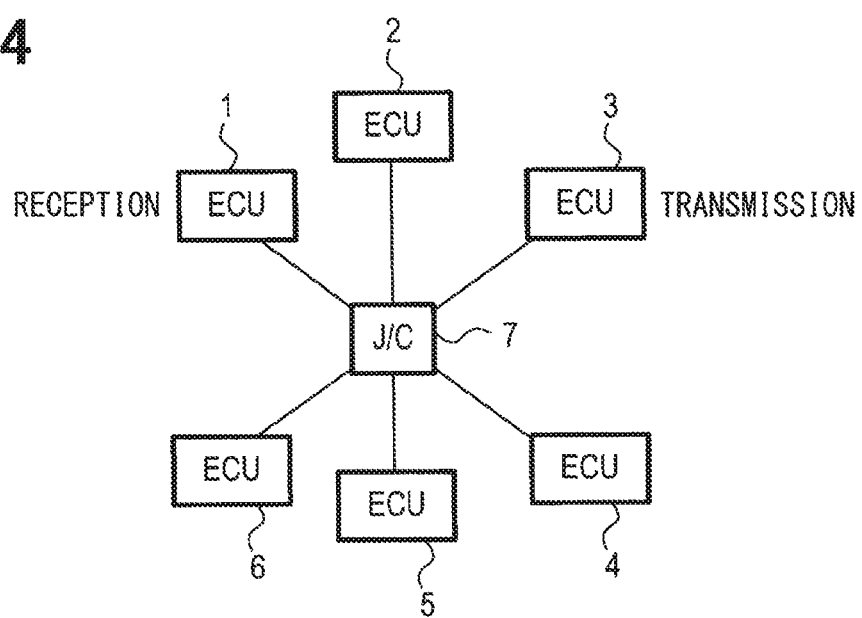
FIG. 4 illustrates a network configuration in which a simulation is performed.
Figure 5:
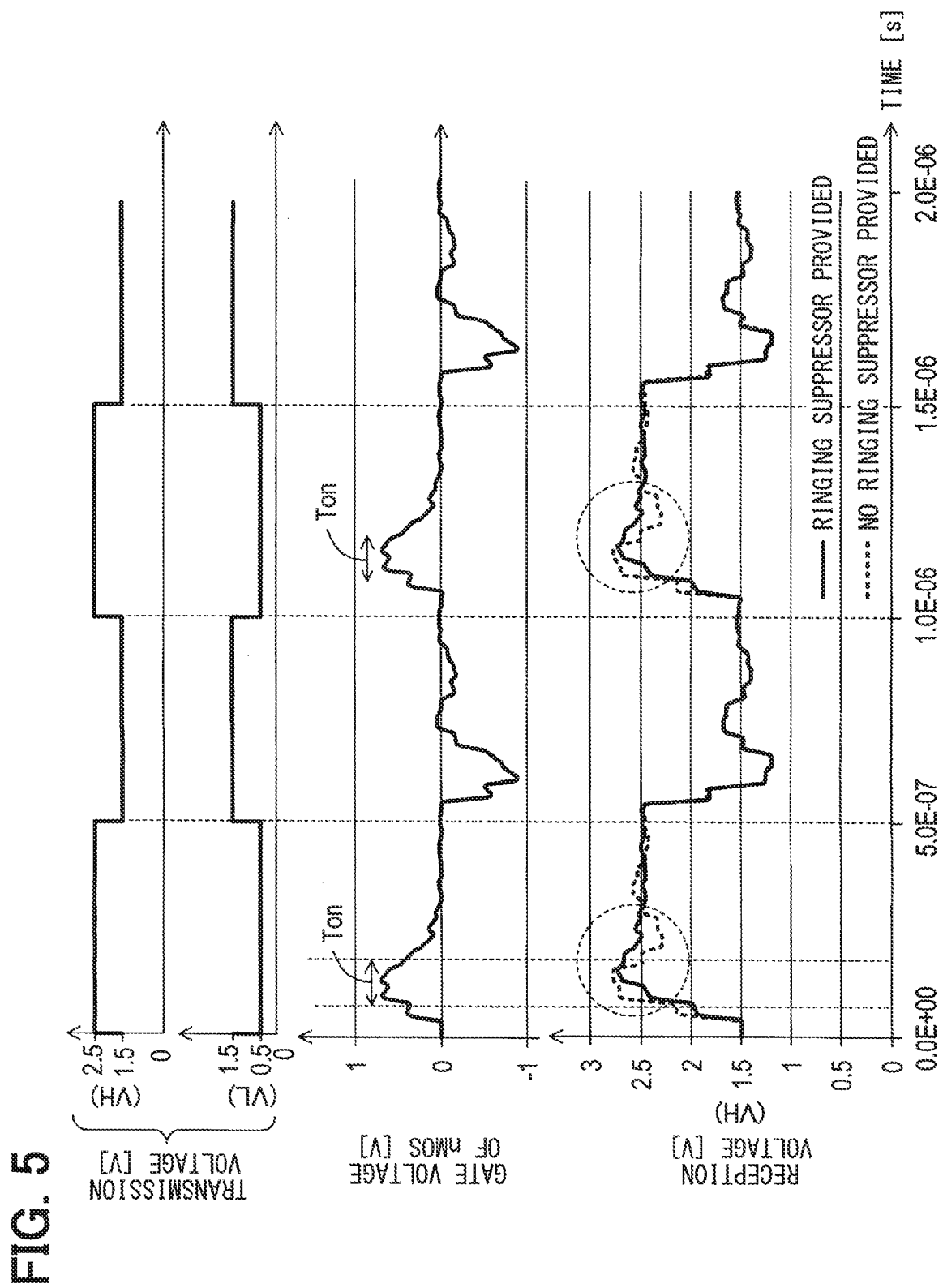
FIG. 5 is a waveform diagram of a simulation result illustrating an effect of the ringing suppressor in the first embodiment of the present disclosure.

FIG. 5 illustrates a simulation result of a waveform in a situation where (i) the ECU 1 having the suppressor 20 shown in FIG. 3 is connected to a network having a topology shown in FIG. 4, and (ii) one of the ECUs 2 to 6 (e.g., ECU 3) in the network transmits a signal.

In FIG. 4, a junction (J/C) 7 is a connection point for connecting the transmission lines of the ECUs 1 to 6. In FIG. 5, a transmission voltage means VH and VL on the transmission side, a reception voltage means VH on the reception side, and the gate voltage of the nMOS 21 is more specifically the gate-source voltage. In FIG. 5, the drive of the transmission line 3 on the transmission side is started at 0 seconds (i.e., 0.0E+00) and 1 microsecond (i.e., 1.0 E–06) on the horizontal axis. The drive of the transmission line 3 on the transmission side is stopped at 0.5 microseconds (i.e., 5.0 E–07) and 1.5 microseconds (i.e., 1.5 E–06).

In the suppressor 20, when the differential signal changes from a low level to a high level, the capacitor 22 starts to be charged via the resistance element 23. When charging of the capacitor 22 is started, a current flows through the resistance element 23, so that the gate voltage (i.e., the gate-source voltage) of the nMOS 21 rises and the nMOS 21 turns ON, as shown in FIG. 5. As the charging of the capacitor 22 progresses and the charging current flowing through the resistance element 23 decreases, the nMOS 21 turns OFF.

In such manner, the nMOS 21 is turned ON only for a preset period after the differential signal changes to the high level and the gate voltage exceeds the ON threshold voltage of the nMOS 21 due to the charging of the capacitor 22, until the charging current of the capacitor 22 decreases and the gate voltage lowers below the ON threshold voltage. In FIG. 5, Ton is an ON time period during which the nMOS 21 is turned ON. The ON time period Ton is shorter than the preset time TS during which the pMOS 31 is turned OFF. The ON time period Ton can be changed depending on the capacitance value of the capacitor 22 and the resistance value of the resistance element 23.

When the nMOS 21 is turned ON, the signal lines 3H and 3L are connected by the ON resistance of the nMOS 21. Therefore, when the nMOS 21 is turned ON, the impedance between the signal lines 3H and 3L decreases, and ringing occurring in the differential signal is suppressed due to the decrease of impedance.

In the lowermost row of FIG. 5, the waveform with a solid line is the VH waveform when the function of the suppressor 20 is provided, and the waveform with the dotted line is the VH waveform when the function of the suppressor 20 is not provided. The dotted line circles in FIG. 5 show instances where signal pulsation (i.e., ringing) is suppressed during the rise of the voltage VH by turning ON the nMOS 21 of the suppressor 20.

1-3. Operation of the Stopper

When the suppressor 20 lowers the impedance between the signal lines 3H and 3L, there is the possibility that the differential voltage may be lowered excessively from the high level voltage and thus be erroneously recognized as being at the low level.

As a result, when the comparator 32 detects that the voltage VH has dropped below the lower voltage threshold. VthL, the stopper 30 determines that the differential voltage has dropped below the voltage lowering determination voltage, and turns OFF the pMOS 31, thereby stopping the stopper 30 from lowering the impedance. In such manner, the ECU 1 and the ringing suppressor circuit 11 of the present embodiment can limit and/or prevent the excessive lowering of the differential voltage by amounts that are well below the high level voltage.

Figure 6:
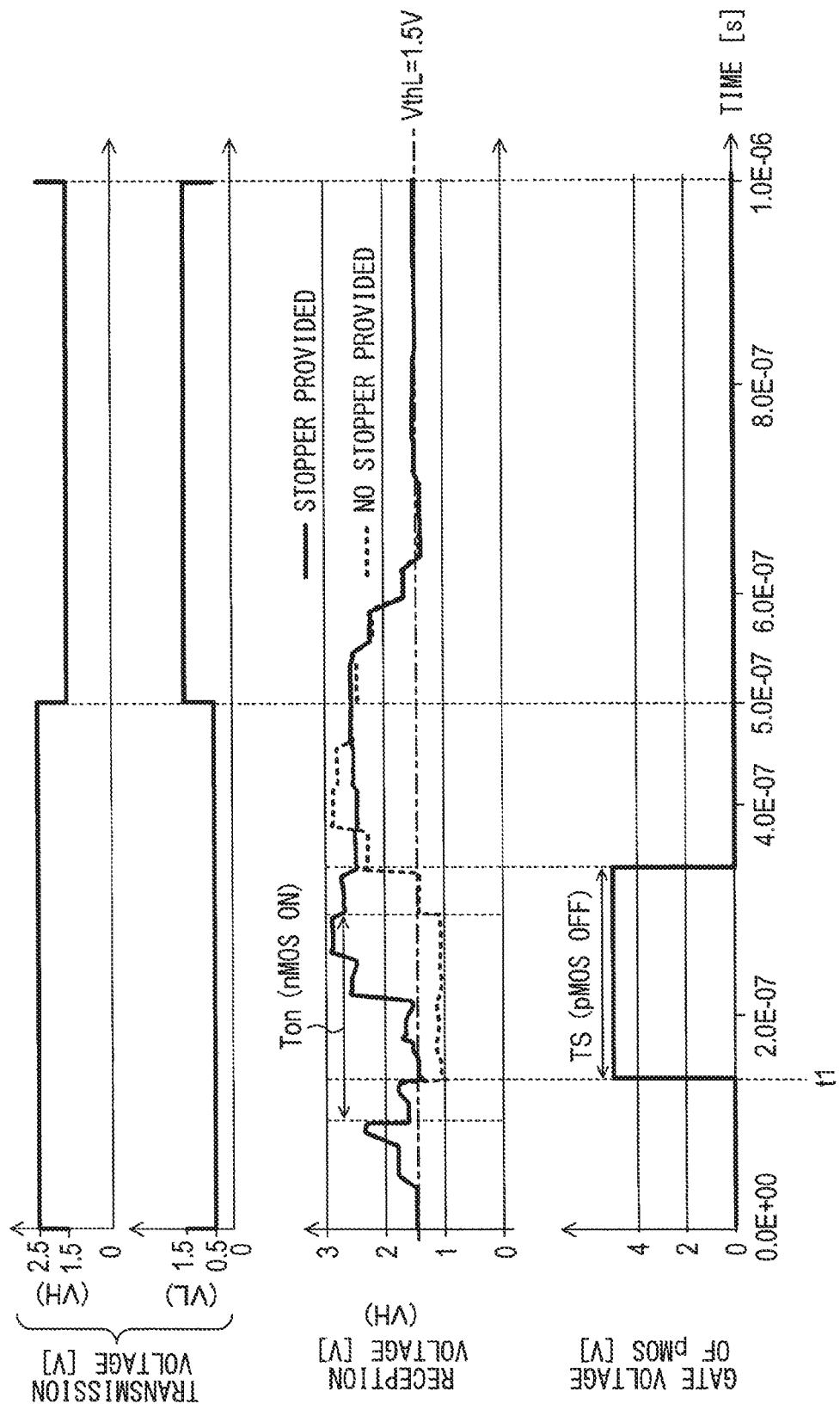
FIG. 6 is another waveform diagram of the simulation result illustrating an effect of the ringing suppressor circuit in the first embodiment of the present disclosure.

In FIG. 6, a simulation result of the waveform illustrates a situation in which the ECU 1 shown in FIG. 1 is connected to the network shown in FIG. 4 where one of the ECUs 2 to 6 in the network transmits a signal.

In FIG. 6, the VH and VL transmission voltages on the transmission side are the same as those shown in FIG. 5. Similarly, the drive of the transmission line 3 on the transmission side is started at 0 seconds (0.0E+00) and stops at 0.5 μsec (5.0E–07). In the second row of FIG. 6, the VH waveform having the solid line shows the voltage VH when the ECU 1 has the stopper 30, and the dotted line waveform shows VH when the ECU 1 does not include the stopper 30, for example, as shown in FIG. 3.

As shown in FIG. 6, when the voltage VH drops below the lower voltage threshold VthL at time t1 due to the nMOS 21 turning ON, the pMOS 31 is turned OFF for a preset time period TS to keep the nMOS 21 from performing the ringing suppression function and thereby limiting and/or preventing further drops in voltage VH.

1-4. Effects

According to the first embodiment described above, it is possible to limit and/or prevent the ringing caused by the transmission of the differential signal and to limit and/or prevent the excessive lowering of the differential voltage below the high level voltage. When the differential signal changes from the low level to the high level, the suppressor 20 lowers the impedance between the signal lines 3H and 3L for a certain period of time to suppress the ringing. Even in instances where the impedance is lowered for too long a time, which may cause an excessive lowering of the differential voltage, the stopper 30 can limit and/or prevent such excessive lowering of the differential voltage.

2. Second Embodiment

2-1. Difference from the First Embodiment

Since the basic configuration of the second embodiment is the same as that of the first embodiment, the description focuses on the differences from the first embodiment. Like elements and features in the second embodiment use the same reference numbers as those elements and features in the first embodiment, and a repeat description of such elements and features may be omitted.

Figure 7:
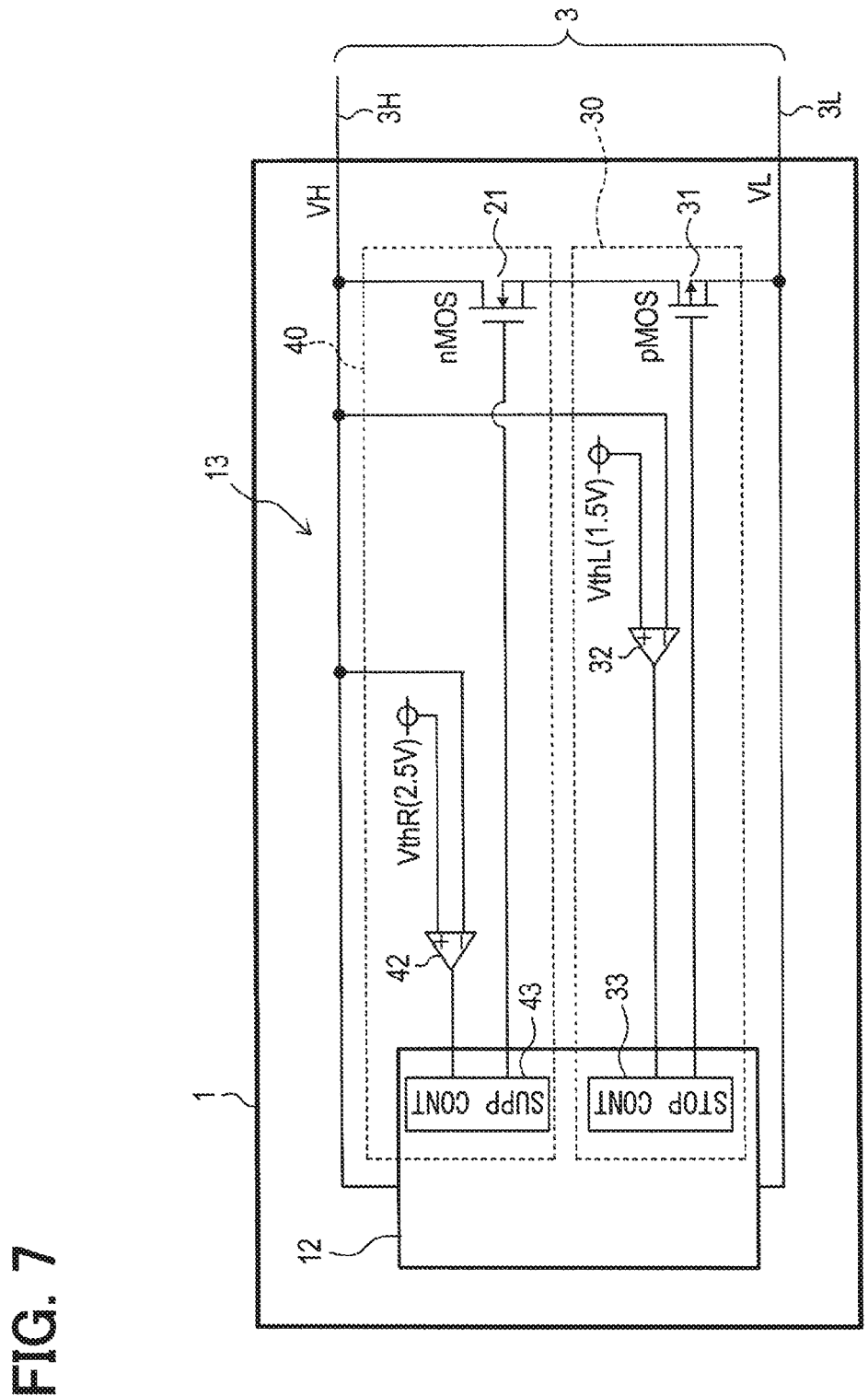
FIG. 7 illustrates a configuration of the ECU including a ringing suppressor circuit according to a second embodiment of the present disclosure.

In FIG. 7, a ringing suppressor circuit 13 in the second embodiment includes a suppressor 40 instead of the suppressor 20 in the first embodiment. The suppressor 40 includes a comparator 42 and a suppression controller 43 for controlling the nMOS 21. As shown in FIG. 7, the suppression controller 43 is included in the reception circuit 12, but the suppression controller 43 may be provided separately from the reception circuit 12.

The comparator 42 compares the voltage VH with a predetermined ringing threshold voltage (VthR), When the voltage VH exceeds the ringing threshold voltage VthR, the comparator 42 may output a low level output signal. The output signal of the comparator 42 is input into the suppression controller 43.

The ringing threshold voltage VthR is a voltage equal to or greater than the voltage VH (i.e., 2.5 V) when the differential signal is at a high level. For example, in the present embodiment, the ringing threshold voltage VthR may be set to 2.5 V. The present embodiment also assumes that the voltage VL is 0.5 V when the differential signal changes to the high level. The comparator 42 then determines whether the differential voltage exceeds 2 V, where 2 V is the difference between the ringing threshold voltage VthR and the voltage VL (i.e., 2.5V–0.5V). Here, such a difference may be referred to as the ringing determination voltage, and in this example, the ringing determination voltage is equal to or greater than the high level voltage of 2V, where the high level voltage is the differential voltage between VH and VL when the transmission line 3 is being driven.

The ringing voltage threshold VthR may be higher than 2.5 V such that the ringing determination voltage has a value higher than 2V The difference between the VH and VL voltages, that is, the differential voltage, may be detected by an operational amplifier. The detected differential voltage and the ringing determination voltage of 2 V may then be compared by the comparator 42.

Figure 8:
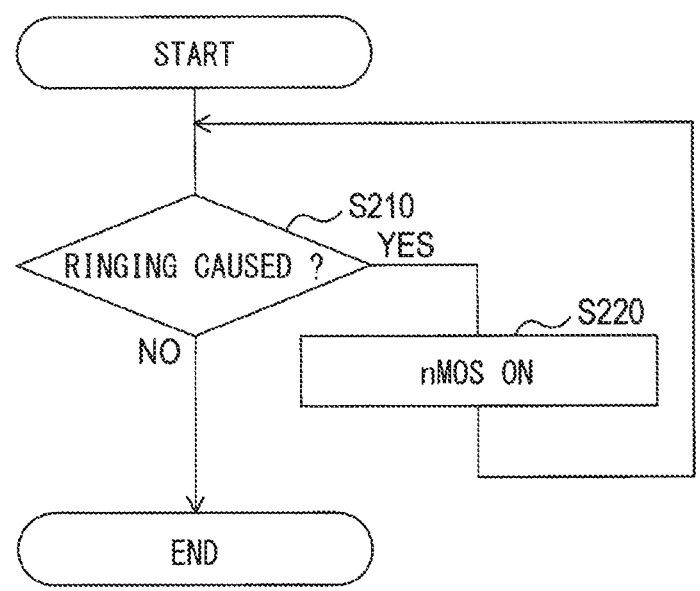
FIG. 8 is a flowchart of an operation of a suppression controller in the second embodiment of the present disclosure.

During normal operation, the suppression controller 43 turns the nMOS 21 OFF and performs the process shown in FIG. 8. At S210, the suppression controller 43 determines whether ringing occurs or is caused in the differential signal based on the output signal of the comparator 42 when the differential signal changes from the low level to the high level.

Specifically, when the suppression controller receives a low level output signal from the comparator 42, the suppression controller 43 determines that the voltage VH exceeds the ringing voltage threshold VthR. As such, the suppression controller determines that the differential voltage (i.e., VH−VL) exceeds the ringing determination voltage, and that ringing has occurred or is caused in the differential signal. When the suppression controller 43 determines that ringing has occurred, i.e., "YES" at S210, the process proceeds to S220. At S220, the suppression controller 43 turns the nMOS 21 ON for a preset time TR to lower the impedance between the signal lines 3H and 3L and the suppression controller then performs the process at S210 again.

In the second embodiment, the preset, constant time TR, during which the nMOS 21 is turned ON, is shorter than the preset time TS, during which the pMOS 31 is turned OFF. Similar to the elements and features for measuring the preset time TS described in the first embodiment, the preset time TR may be measured by a clock in the reception circuit 12 or by an analog charging/discharging circuit.

2-2. Operation of the Suppressor and the Stopper

Figure 9:
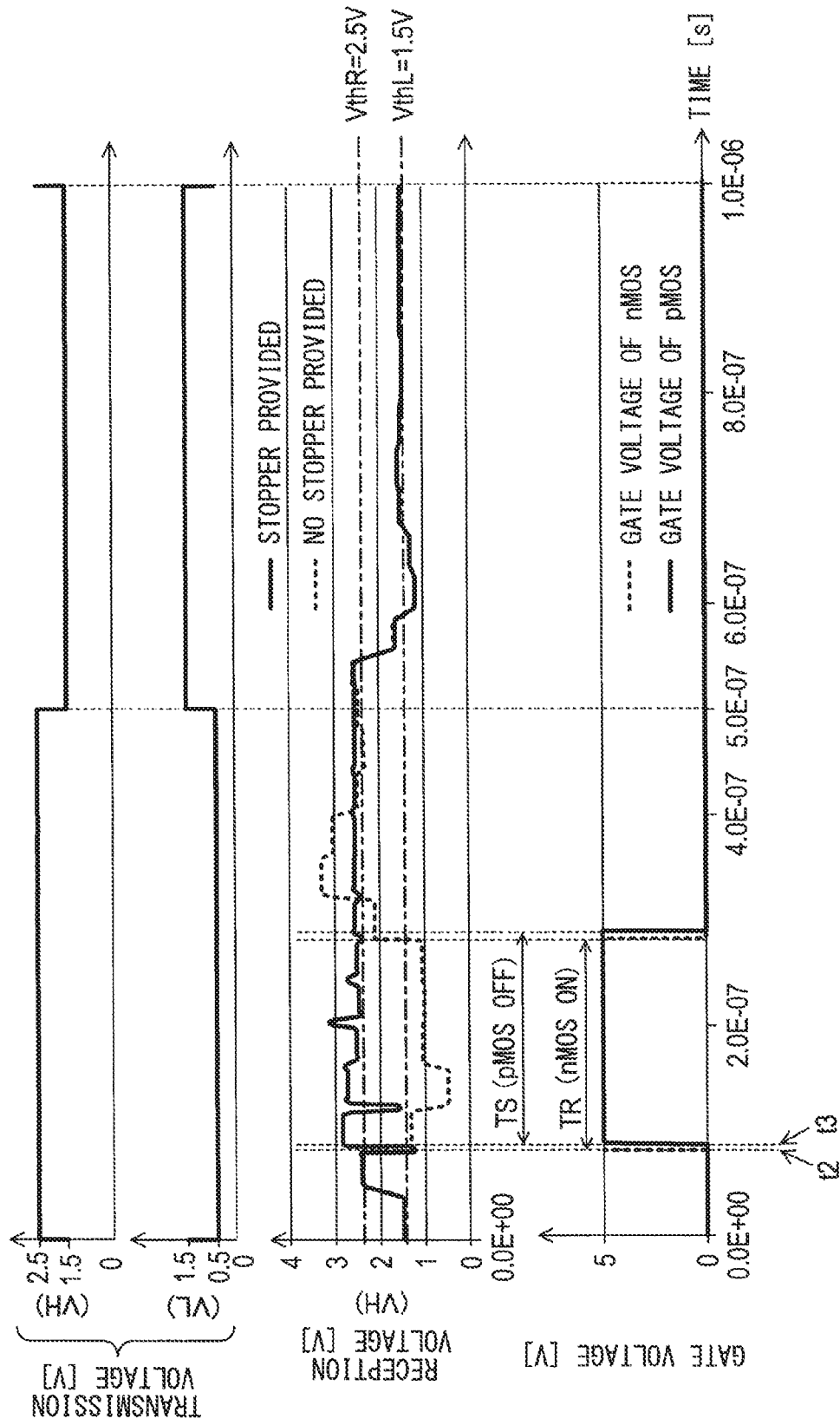
FIG. 9 is a waveform diagram of a simulation result illustrating an effect of the ringing suppressor circuit in the second embodiment of the present disclosure.

FIG. 9 shows a simulation result of the waveform when the ECU 1 shown in FIG. 7 is connected to the network in FIG. 4 and one of the ECUs 2 to 6 in the network transmits a signal.

The transmissions voltages VH and VL on the transmission side in FIG. 9 are the same as the transmission voltages in FIG. 5. That is, at 0 seconds (0.0E+00) in FIG. 9, the drive of the transmission line 3 on the transmission side is started, and at 0.5 microseconds (5.0E−07) the drive of the transmission line 3 on the transmission side is stopped. For the reception voltage in the second row of FIG. 9, the solid line is the VH waveform when the ECU 1 includes the stopper 30, and the dotted line VH waveform is when the ECU 1 does not include the stopper 30, that is, where the source of the nMOS 21 is always connected to the low potential signal line 3L.

As shown in FIG. 9, when the voltage VH exceeds the ringing threshold voltage VthR at time t2 after the differential signal changes to the high level, the suppression controller 43 turns ON the nMOS 21 for a preset period of time TR to suppress the ringing. The voltage VH drops when the nMOS 21 is turned ON.

When the voltage VH drops below the lower voltage threshold VthL at time t3, the stop controller 33 turns OFF the pMOS 31 for a preset period of time TS to keep the nMOS 21 from performing the ringing suppression function to limit and/or prevent any further drops of the voltage VH below the lower voltage threshold VthL.

2-3. Effects

The second embodiment described above can achieve the same effects as those described in the first embodiment. Since the suppressor 40 is configured to lower the impedance between the signal lines 3H and 3L when the suppression controller 43 determines that ringing has occurred/is occurring, impedance lowering can be easily optimized. In addition, the suppressor 40 is configured to determine that the ringing has occurred when the suppression controller 43 determines that the differential voltage exceeds the ringing determination voltage, where the ringing determination voltage is set to be equal to or greater than the high level voltage. In such manner, when the differential signal changes to the high level, the ECU 1 and ringing suppressor circuit 13 of the second embodiment can detect ringing as soon as possible and turn the nMOS 21 ON to suppress the ringing.

3. Other Embodiments

Although embodiments of the present disclosure have been described above, the present disclosure is not limited to the above-described embodiments and various modifications can be made.

For example, the stop controller 33 may be configured to start the operation shown in FIG. 2 when the differential signal changes to the high level (i.e., when the transmission line 3 is driven). The suppression controller 43 may also be configured to start the operation shown in FIG. 8 when the differential signal changes to the high level.

The stop controller 33 and the suppression controller 43 may be realized by as hardware such as digital circuit elements, analog circuit elements, logical circuit elements, or a combination of circuit elements, where a hardware-based stop controller 33 and suppression controller 43 are so configured to perform their associated functions, as described above. Both the stop controller 33 and the suppression controller 43 may further be realized as a microcontroller having a CPU and a semiconductor memory such as a RAM or a ROM. In such a case, the above-described functions/processes performed by the stop controller 33 and the suppression controller 43 may be realized by the CPU executing a program/instruction set stored in the semiconductor memory to perform the processes associated with the stop controller 33 and the suppression controller 43. The semiconductor memory may be a substantive, non-transitory storage medium.

A plurality of functions included in one component in the above embodiment may be realized by a plurality of components. Similarly, one function of one component may be realized by a plurality of components. In addition, a plurality of functions of a plurality of components may be realized by one component, or one function realized by a plurality of components may be realized by one component. One or more parts in the above embodiments may be omitted. One or more parts from one embodiment may be added to or replaced by one or more parts from other embodiments.

In addition to the riming suppressor circuits 11 and 13 described above, the present disclosure can be realized in various forms such as a communication device including the ringing suppressor circuits 11 and 13, or a ringing suppression method.

Although the present disclosure has been fully described by embodiments with reference to the accompanying drawings, it is to be noted that various changes and modifications will become apparent to those skilled in the art, and such changes, modifications, and summarized schemes are to be understood as being within the scope of the present disclosure.

What is claimed is:

1. A ringing suppressor circuit connected to a transmission line for transmitting a differential signal that switches between a high level and a low level via a high potential and low potential pair of signal lines, and for suppressing a ringing in the differential signal, the ringing suppressor circuit comprising:
   a ringing suppressor configured to lower an impedance between the pair of signal lines when the differential signal switches from the low level to the high level; and
   a stopper configured to
      stop the ringing suppressor from lowering the impedance between the pair of signal lines when the stopper determines that a voltage of the differential signal drops below a voltage lowering determination voltage, wherein
      the stopper is further configured to set the voltage lowering determination voltage lower than a differential voltage of the differential signal when the transmission line is transmitting the differential signal at the high level.

2. The ringing suppressor circuit of claim 1, wherein the ringing suppressor is further configured to lower the impedance between the pair of signal lines for a preset amount of time.

3. The ringing suppressor circuit of claim 1, wherein the ringing suppressor is further configured to
   detect a ringing in the differential signal when the differential signal switches from the low level to the high level, and
   lower the impedance between the pair of signal lines when the ringing in the differential signal is detected.

4. The ringing suppressor circuit of claim 3, wherein the ringing suppressor is further configured to
   determine that the ringing is caused when the differential voltage exceeds a ringing determination voltage, and
   set the ringing determination voltage to be equal to or greater than the differential voltage when the transmission line is transmitting the differential signal at the high level.

* * * * *